United States Patent [19]

Foo et al.

[11] Patent Number: 5,120,680
[45] Date of Patent: Jun. 9, 1992

[54] METHOD FOR DEPOSITING DIELECTRIC LAYERS

[75] Inventors: Pang-Dow Foo, Berkeley Heights; Tai-Chan D. Huo, New Providence; Man F. Yan, Berkeley Heights, all of N.J.

[73] Assignee: AT&T Bell Laboratories, Murray Hill, N.J.

[21] Appl. No.: 555,128

[22] Filed: Jul. 19, 1990

[51] Int. Cl.$^5$ .............................................. H01L 21/02
[52] U.S. Cl. ........................... 437/238; 148/DIG. 18; 427/99; 427/255; 437/228
[58] Field of Search .................. 437/238, 228; 427/99, 427/255

[56] References Cited

U.S. PATENT DOCUMENTS

| | | | |
|---|---|---|---|
| 4,268,711 | 5/1981 | Gurev | 437/238 |
| 4,681,653 | 7/1987 | Purdes et al. | 156/614 |
| 4,690,746 | 9/1987 | McInernay et al. | 204/192.32 |
| 4,732,761 | 3/1988 | Machida et al. | 437/238 |
| 4,784,719 | 11/1988 | Schultz | 437/225 |
| 4,872,947 | 10/1989 | Wang et al. | 427/294 |
| 4,877,641 | 10/1989 | Dory et al. | 437/238 |
| 4,892,753 | 1/1990 | Wang et al. | 427/294 |
| 4,894,352 | 1/1990 | Lane et al. | 437/238 |
| 4,916,091 | 4/1990 | Freeman et al. | 437/238 |

OTHER PUBLICATIONS

S. Matsuo et al.; "Low Temperature CVD Method Utilizing an ECR Plasma", *Japanese Journal of Applied Physics*, vol. 22, No. 4, Apr. 1983, pp. L210–L212.

K. Machida et al., "SiO$_2$ Planerization Technology of Biasing and DECRA Plasma Deposition for Submicron Interconnections", *J. Vac. Sci., Tech. B4* (4) Jul./Aug. 1986, pp. 818–821.

Tsunoda, "Masking Effects of Antimony Diffusion in Silicon From a Doped Oxide Source", *Japanese Journal of Applies Physics*, vol. 15, No. 12, Dec. 1976, pp. 2475–2476.

J. Vac. Sci. Technol. B4 (4), 1986, "SiO$_2$ Planarization Technology With Biasing and Electron Cyclotron Resonance Plasma Deposition for Submicron Interconnections," by K. Machida et al., pp. 818–821.

Solid State Technology, 1988, "Plasma TEOS Process for Interlayer Dielectric Applications," by B. L. Chin and E. P. van de Ven, pp. 119–122.

J. Vac. Sci. Technol. 15(3), 1978, "Study of Planarized Sputter-Deposited SiO$_2$", by C. Y. Ting et al., pp. 1105–1112.

J. Vac. Sci. Technol. B3, 1985, "SiO$_2$ Planarization by Two-Step rf Bias-Sputtering," by T. Mogami, M. Morimoto, H. Okabayashi, and E. Nagasawa, pp. 857–861.

J. Vac. Sci. Technol. B2, 1987, "Deposition of Planarized Dielectric Layers by Biased Sputter Deposition", by B. Singh, O. Mesker, and D. Devlin, pp. 567–574.

*Primary Examiner*—Brian E. Hearn
*Assistant Examiner*—Laura M. Holtzman
*Attorney, Agent, or Firm*—M. I. Finston; E. E. Pacher

[57] ABSTRACT

Disclosed is a method for forming a silicon dioxide layer on a substrate by radio-frequency deposition from a plasma comprising oxygen, argon, and tetraethyl orthosilicate (TEOS) or tetramethyl cyclotetrasiloxane (TMCTS). A negative bias is imparted to the substrate. The resulting ion bombardment induces surface migration. Because TEOS and TMCTS have a relatively high mean free path for surface migration, the filling of soft spots and key holes is promoted.

3 Claims, 5 Drawing Sheets

METHOD FOR DEPOSITING DIELECTRIC LAYERS

FIELD OF THE INVENTION

The invention relates to the formation of dielectric films on electronic substrates for the purpose of manufacturing integrated circuits.

BACKGROUND OF THE INVENTION

At least some interconnections in integrated circuits are made by strip-like metallic conductors that are formed by patterning a deposited metal film. As the technology of integrated circuits evolves toward higher circuit densities, circuit designs call for decreasing both the widths of such metal interconnections, and the spacings between them.

One parameter for describing the geometrical configuration of an intermetallic spacing is the aspect ratio, i.e., the height of the metal film divided by the distance between the adjacent strip-like conductors that define the spacing. Although conventional spacings are substantially greater than 1 μm in width and have an aspect ratio substantially less than 1, newer circuit designs call for spacings of 1 μm or even less, and for aspect ratios of 1 or more.

Conventionally, the patterned metallic layers that represent such interconnections are overcoated with a layer of dielectric material, typically a silicon oxide material. (Additional metal interconnections may be formed by patterning a metallic layer deposited above such a dielectric layer. In such a case, the dielectric layer is referred to as an "interlevel dielectric film.")

To be effective, the dielectric coating must fill the intermetallic spacings substantially without defects. Two important classes of defects have been identified; they are "soft spots" and "key holes." A soft spot is a low-density region of the dielectric coating, and it is formed where the rate of ion bombardment is reduced by the shadowing effect of the shoulders of the metallic conductor pattern. A key hole is a void in the dielectric coating, and it is formed when shadowing is so severe that dielectric is prevented from depositing within the intermetallic region, while the dielectric deposited on the shoulder regions bounding the intermetallic region grow fast enough to merge above the void.

As aspect ratios increase, it becomes more difficult to deposit dielectric layers such that the intermetallic spacings are filled substantially without soft spots and key holes. This is because shadowing effects become more severe at higher aspect ratios. Various deposition methods have been proposed for forming dielectric layers, such as intermetallic dielectric films, to fill metallic interconnections having aspect ratios of one or greater. For example, the use of radio-frequency (RF) bias sputtering to deposit silicon dioxide films was reported by C. Y. Ting, et al., *J. Vac. Sci. Technol.*, 15, (1978), p. 1105, T. Mogami, et al., *J. Vac. Sci. Technol.*, B3, (1985), p. 857, and B. Singh, et al., *J. Vac. Sci. Technol.* B5, (1987), p. 567. However, commercial applications of this method may be limited because the method currently achieves a deposition rate of less than 200 Å/minute, whereas commercial applications typically require deposition rates greater than 1000 Å/minute for single-wafer reactors, or 500 Å/minute (depending on the number of wafers processed at one time) for multiple-wafer reactors. Another method, bias electron cyclotron resonance plasma deposition, has been described, for example, by K. Muchida, et al., *J. Vac. Sci. Technol.*, B4, (1986), p. 818. However, problems associated with thickness non-uniformity and particulate contamination have not been completely solved for this method. Yet another method, plasma enhanced chemical vapor deposition (PECVD) using TEOS (tetraethyl orthosilicate) precursor has been described, for example, by B. L. Chin, et al., *Solid State Technol.*, (April 1988), p. 119. This method is the method most widely adopted for depositing interlevel silicon dioxide films. However, it is generally unfeasible to deposit high-quality dielectrics by this method in intermetallic spacings having aspect ratios greater than about 0.8.

Another application of PECVD for forming silicon dioxide layers is described in U.S. Pat. No. 4,681,653, issued to Purdes, et al. on Jul. 21, 1987. Purdes used silane and nitrous oxide precursors to deposit planarizing silicon dioxide films. A very large substrate bias of $-900$ volts provided a large back-sputtering yield to planarize the film. However, the high substrate bias used with this technique may result in radiation damage that can harm device performance.

Thus, practitioners in the art have so far sought, without success, a method for forming, over high-aspect-ratio metallization patterns, silicon dioxide films of excellent quality (i.e., that are substantially free of soft spots and key holes) that is relatively fast and that is free of potential problems due to radiation damage, thickness non-uniformity, and particulate contamination.

SUMMARY OF THE INVENTION

The invention involves the use of PECVD for forming silicon dioxide films. The gas mixture used includes oxygen, argon, and a silicon-containing precursor. The silicon-containing precursor is either tetraethyl orthosilicate (TEOS) or tetramethyl cyclotetrasiloxane (TMCTS). Because TEOS and TMCTS have a relatively high mean free path for surface migration, the filling of soft spots and key holes is promoted.

Thus, in one embodiment, the invention includes the steps of: providing a substrate within a vacuum chamber; providing a mixture of gases which can react in a plasma to form silicon dioxide for deposit, the gas mixture including oxygen, argon, and either TEOS or TMCTS or both; flowing the gas mixture over the substrate; exciting the gas mixture with an RF field; and maintaining a negative dc bias on the substrate. The dc bias and the composition of the gas mixture are selected such that there results a silicon dioxide film substantially free of soft spots and/or key holes.

In a preferred embodiment, the dc bias imposed on the substrate is between about $-300$ volts and about $-500$ volts. At such voltages, the risk of radiation damage is relatively low.

DETAILED DESCRIPTION

In a currently preferred embodiment of the inventive method, the deposition takes place in a parallel plate RF deposition reactor. For example, one useful reactor for this purpose is the parallel plate unit, Model 700, manufactured by the Plasma-Therm Co. (The reactor is modified by providing a source of TEOS or TMCTS vapor, as described below.) In particular, it is desirable to use a reactor that is equipped with load locks, in order to reduce particulate contamination.

Figure 1:
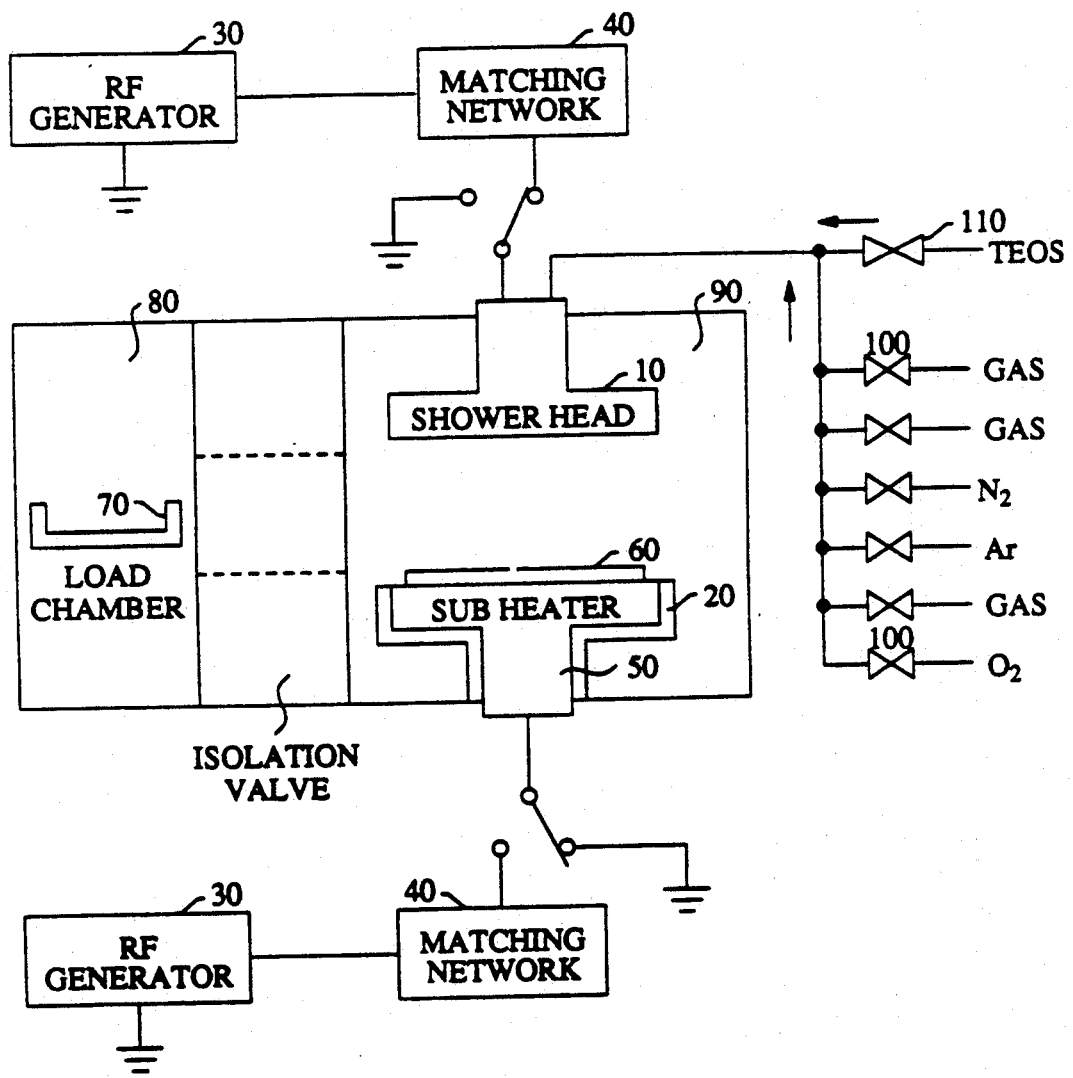
FIG. 1 is a schematic drawing of an exemplary parallel plate reactor suitable for practicing the inventive method.

As shown in FIG. 1, the upper electrode 10 is a "shower head;" i.e. a hollow body having a flat, perforated, lower (as shown in the figure) surface. The reactant gases are mixed within the hollow core of the shower head, and as a result, an essentially homogeneous gas mixture is evenly delivered to the upper (as shown in the figure) surface of the wafer. The shower head is exemplarily 11 inches (27.9 cm) in diameter. The lower electrode 20, also referred to as the "substrate holder," is an aluminum disk parallel to the upper electrode and 1.5 inches (3.8 cm) below it. The lower electrode has the same diameter as the shower head, exemplarily 11 inches (27.9 cm).

The upper and lower electrodes are typically connected to the same RF power supply 30 and matching network 40 by separate cables. RF power can be supplied to either the upper or lower electrode. When either electrode is powered, the other is grounded. (Typically, a single power supply 30 and a single matching network 40 are used. The power supply and matching network are shown twice in the schematic drawing of FIG. 1 to simplify the drawing.) The radio frequency applied to the electrodes is, for example, 13.56 MHz. Exemplary maximum RF output powers are 600 W to the upper electrode and 700 W to the lower electrode.

Built into the lower electrode is an embedded resistance heater 50, capable of heating the substrate 60 to, typically, about 400° C. (When the metallization pattern is composed of aluminum, a useful range of substrate temperatures is 320° C.–350° C. because hillocks may form in the aluminum films at temperatures substantially higher than 350° C. If tungsten metallization is provided instead of aluminum, a useful range is 320° C.–500° C., because tungsten films can tolerate higher temperatures. A typical substrate temperature during deposition is 320° C.)

In a typical loading operation prior to deposition, three silicon wafers, each 125 mm in diameter, are placed on an aluminum wafer tray 70. The wafer tray is then transferred by a mechanical arm from the loading chamber 80 to the processing chamber 90.

In a typical parallel plate reactor, several different processing gases (for example, six gases in the Plasma-Therm Mod. 700) can be individually metered into the shower head by separate flow meters 100, and then distributed by the shower head within the processing chamber. For purposes of the currently preferred embodiment, two reactant gases, namely oxygen and argon, are metered and distributed in that way. High-purity nitrogen is flowed into the processing chamber through the shower head to back fill the reactor to atmospheric pressure after the deposition of a film or films has been completed. Additionally, TEOS or TMCTS vapor is distributed by the shower head. Because TEOS and TMCTS are liquids at room temperature and atmospheric pressure, this precursor material is contained in, for example, a stainless steel container (not shown) connected to the shower head through a stainless steel tube (not shown). Because the vapor pressure of, e.g., TEOS is only about 2 torr at 25° C., the container is heated by a heating bath to promote vaporization of the TEOS, and the tube is wrapped with heating tape to prevent condensation of TEOS. The amount of TEOS or TMCTS vapor flowing into the shower head is controlled by a precision flow meter (110). (Although both TEOS and TMCTS are useful as silicon-containing precursors for purposes of the invention, the rest of this description assumes, by way of example, that TEOS is used as the precursor.)

Figure 2:
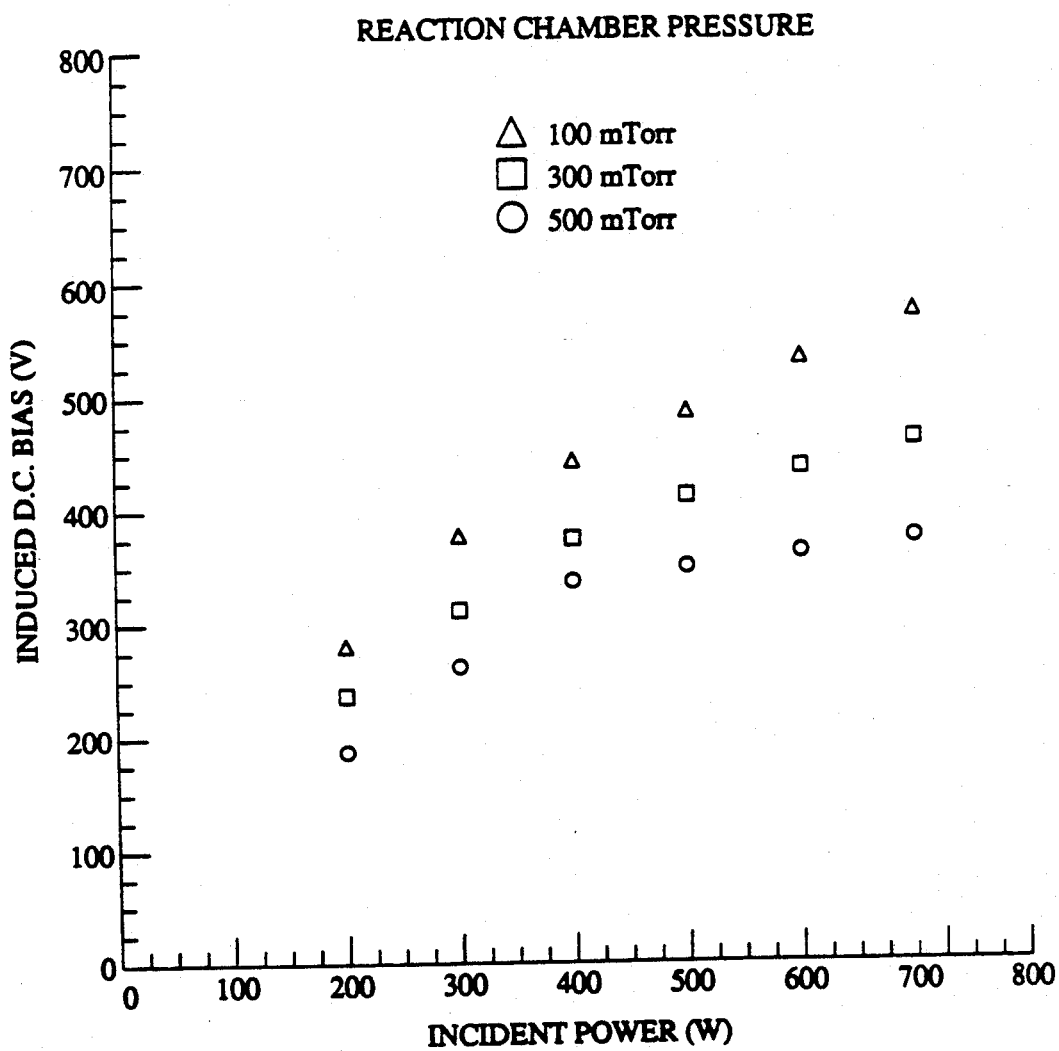
FIG. 2 is a graph showing how the induced DC bias on the substrate depends on the incident RF power and on the reaction-chamber pressure in the reactor of FIG. 1.

The induced DC bias voltage depends upon the incident RF power and the reaction-chamber pressure, as shown in FIG. 2. For example, at a reaction-chamber pressure of 300 mTorr, the induced DC bias voltage rises from about 200 V to about 470 V as the RF power is increased from 200 W to 700 W. Also as shown in FIG. 2, at an incident RF power of 500 W, the bias increases from about 355 V to about 490 V as the chamber pressure is decreased from 500 mTorr to 100 mTorr.

If the bias is too low (in absolute value), the ion bombardment rate is too low, and a low-quality film may be produced, having keyholes and soft spots. If the bias is too high, radiation damage may occur to the substrate. For these reasons, a useful range for the bias is from about −300 V to about −500 V.

A useful range of pressure within the reactor during deposition is 100–500 mTorr, and a preferred pressure is about 300 mTorr. At pressures below about 100 mTorr, the deposition rate is too small to produce commercially acceptable throughput. At pressures above about 500 mTorr, the bias is generally too low, and the quality of the deposited film may be compromised.

A useful range of RF power incident to the reaction chamber is 200–1000 W because within this range, the bias is generally within an acceptable range. Dividing this power by the facial area of the 11-inch (27.9 cm) diameter electrodes gives a useful power density range of 0.33–1.64 W/cm$^2$. A preferred RF power level is about 700 W, corresponding to a power density of about 1.15 W/cm$^2$.

Figure 3:
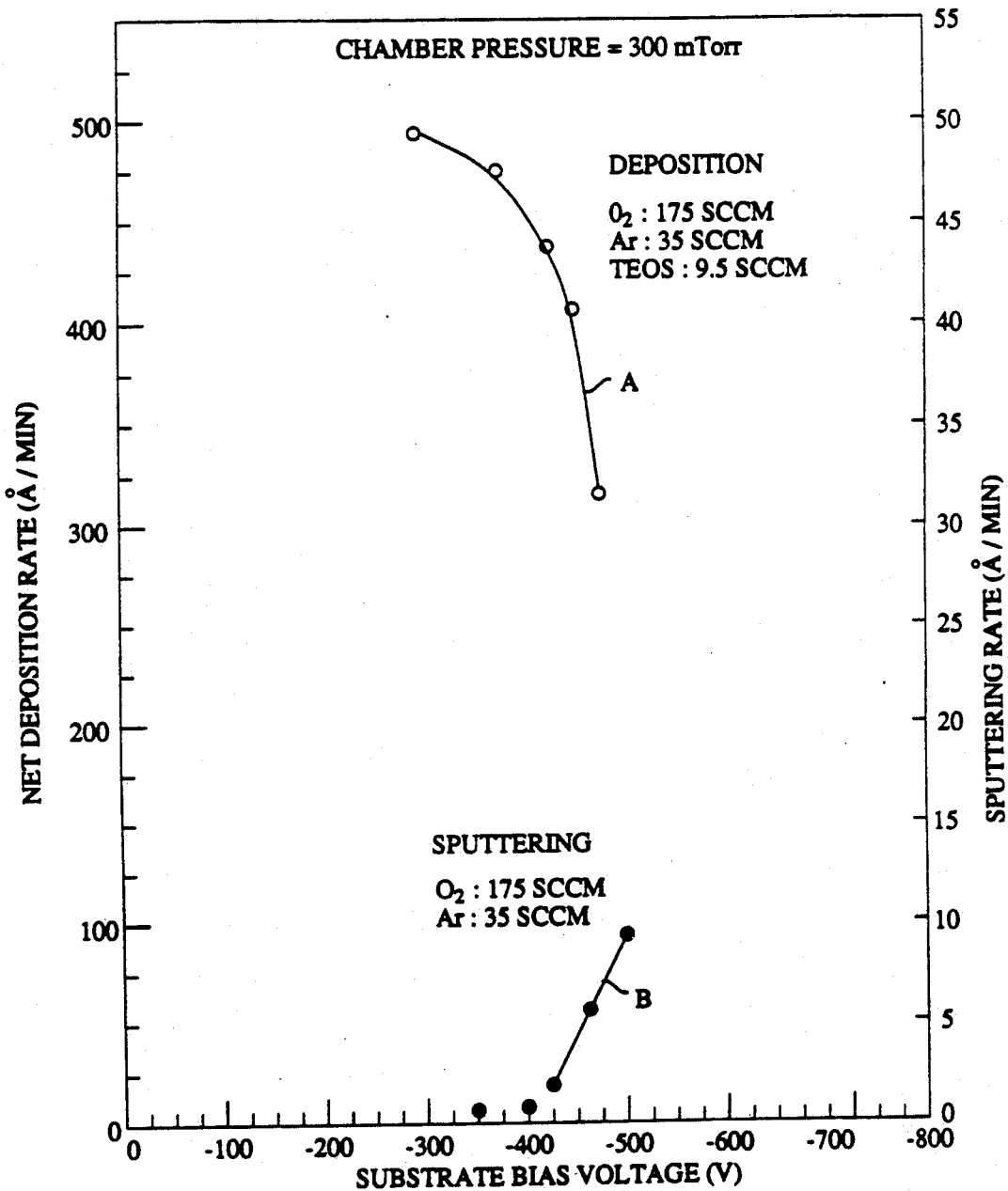
FIG. 3 is a graph showing how, in a typical case, the net deposition rate and the sputtering rate depend on the substrate bias voltage in the reactor of FIG. 1.

As shown by curve A of FIG. 3, the net deposition rate decreases with increasing magnitude of the substrate bias voltage. Because the magnitude of the substrate bias voltage increases with incident RF power, the net deposition rate tends to decrease as the incident RF power increases. For example, when the respective flow rates of oxygen, argon, and TEOS are 175 SCCM, 35 SCCM, and 9.5 SCCM, and the chamber pressure is 300 mTorr, the net deposition rate drops from about 500 Å/minute to about 310 Å/minute as the substrate bias voltage is increased in absolute value from about −300 V to about −460 V. The corresponding change in incident RF power is from about 300 W to about 700 W, as shown in FIG. 2. The primary reason for the decrease in net deposition rate with increasing RF power is that desorption also increases as the RF power is raised.

Desorption is a result of bombardment by ions of both oxygen and argon. In addition to desorption, surface migration of adsorbed reaction by-products (which may, for example, include metastable species) takes place as a result of ionic bombardment. Conventionally, RF power is input to the shower head, which consequently assumes a negative bias, and the substrate is grounded. By contrast, the inventive method involves powering the lower electrode, resulting in a negative bias on the substrate. However, the plasma is always positively charged. As a consequence, a relatively large potential difference is created between the plasma and the substrate, directed such that positive ions are accelerated toward the substrate. This potential difference is typically about 25 times larger than the potential difference (typically about 20 V) that generally obtains between the plasma and a conventionally grounded substrate. The increased potential difference results in a greater energy of ionic bombardment.

Figure 4:
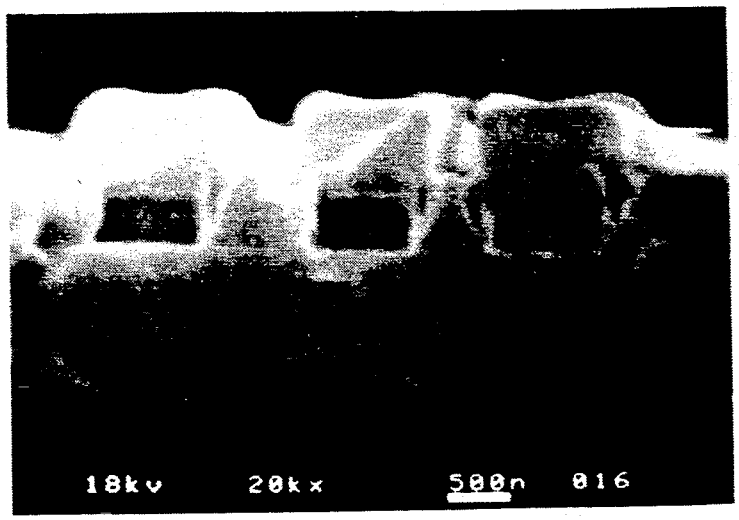
FIGS. 4–6 are photographs depicting the morphological properties of silicon dioxide films formed, respectively, under three different sets of processing conditions. The conditions of FIGS. 4 and 5 differ by a single process parameter, namely, substrate bias. The conditions of FIGS. 5 and 6 also differ by a single process parameter, namely, the inclusion of argon in the gas mixture flowed over the substrate.
Figure 5:
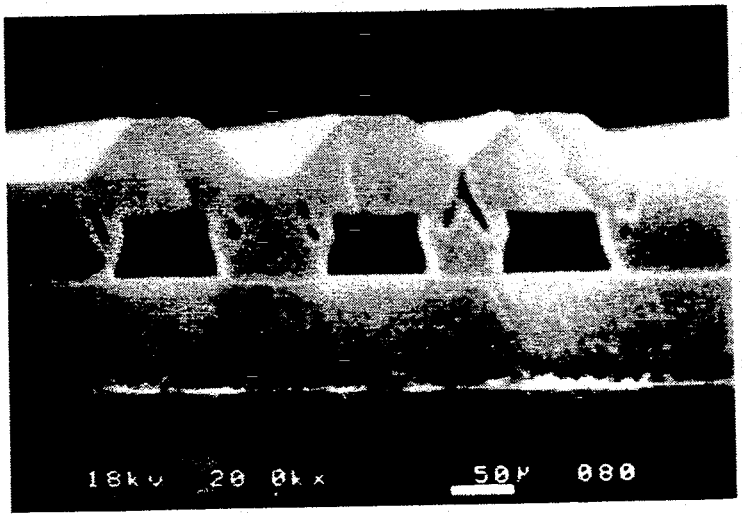

The effect of biasing the substrate is illustrated by a comparison between FIGS. 4 and 5. Both figures represent, schematically, the morphology of a silicon dioxide film deposited over an aluminum metallization pattern on a silicon substrate. FIG. 4 corresponds to a film deposited with a grounded substrate. FIG. 5 corresponds to a film deposited under the same conditions, but with a negatively biased substrate. The gas mixture in both cases consists of oxygen and TEOS, at flow rates, respectively, of 175 SCCM and 9.5 SCCM. It is apparent in FIG. 4 that the film deposited with a grounded substrate exhibits slightly burgeoning shoulders near the edges of the aluminum steps due to directional deposition (i.e., the probability of deposition on the shoulders is greater than the probability of deposition in the spaces between metal strips). It is also apparent in the figure that between the steps, the film exhibits soft areas caused by shadowing effects. By contrast, it is apparent in FIG. 5 that the film deposited with a biased substrate had better step coverage, as evidenced by the pronouncedly sloping facets illustrated in the figure. (I.e., sloping facets imply that there is essentially no shadowing.)

In order to deposit films that are free of keyholes over metallization patterns having intermetallic spacings of 1 μm or less and aspect ratios of 1 or more, it is desirable to create tapered sidewalls by reducing the net deposition rate at the shoulders relative to the tops of the steps and the bottoms of the spacings. In those conventional PECVD methods that use silane as a precursor together with nitrous oxide or oxygen, it is believed that tapered sidewalls are created by ion sputtering. (See, for example, U.S. Pat. No. 4,681,653, cited above.) In the inventive method, by contrast, it is believed that tapered sidewalls are created by surface migration and desorption, both activated by ionic bombardment. Significantly, it is the substrate bias that makes ionic bombardment effective for this purpose. If the substrate were grounded, and not biased, the bombarding ions would have insufficient energy to activate a significant amount of surface migration and desorption.

Reaction by-products, including partially decomposed large precursor molecules (i.e., of TEOS or TMCTS) are believed to be initially adsorbed on the film surface. These molecules are believed to have relatively high mobility between the time that they are adsorbed and the time that they decompose to form $SiO_x$ radicals that are subsequently incorporated in a glass network. This mobility arises by virtue of surface diffusion activated by ionic bombardment, as discussed above. As a consequence of such mobility, the inventive method results in relatively highly conformal deposition over steps. Furthermore, desorption activated by bombardment by argon ions can reduce the deposition rate even when the ion energy is insufficient to cause a significant amount of sputtering. The desorption rate is greatest at 45° incidence. As a consequence, the removal of material from the shoulder regions, which tend to have surfaces oriented substantially at 45° to the incident ion direction, is rapid enough to prevent the formation of key holes even at relatively low bias, i.e., at bias having an absolute value less than about 500 V.

It is further believed that in addition to biasing the substrate, it is necessary to add argon to the gas mixture in order to eliminate soft spots from the deposited silicon dioxide films. That is, surface migration of (partially decomposed) precursor molecules away from the shoulder regions can enhance the deposition rate at the bottom step corner to produce a tapered sidewall. It is believed that argon ions colliding with precursor molecules can transfer their kinetic energy to the precursor molecules. At least a portion of the precursor molecules excited in that manner have too much internal energy to be incorporated in the glass network at the site of the collision. Instead, the excited molecule is either desorbed or else it migrates along the surface. Because argon ions are 2.5 times more massive than oxygen ions, they transfer momentum in collisions more effectively than oxygen ions. Thus, it is believed that the addition of argon to the gas mixture enhances the migration of precursor molecules on the sidewall surfaces. As a result, greater deposition takes place at the bottom corners, and the occurrence of soft spots is consequently reduced or eliminated.

The foregoing theoretical discussion is included for pedagogical reasons only, and is not intended to limit the scope of the claims.

Figure 6:
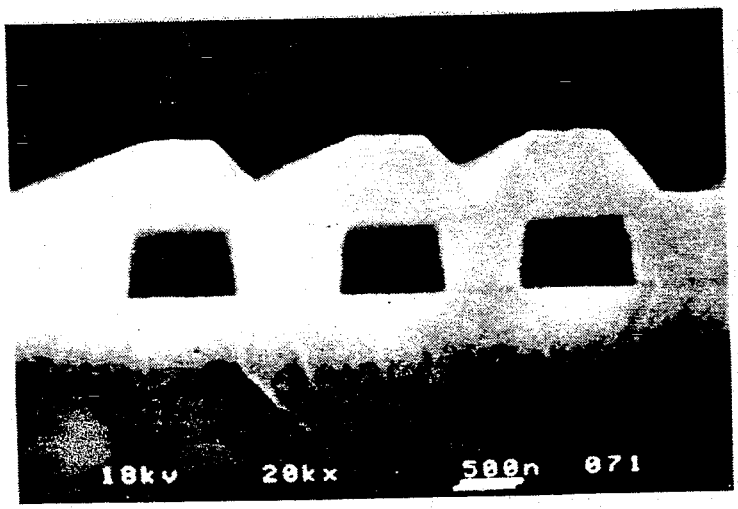

The effect of adding argon to the gas mixture is illustrated by a comparison between FIGS. 5 and 6. As noted, FIG. 5 schematically represents the morphology of a silicon dioxide film deposited on a biased substrate at respective oxygen and TEOS flow rates of 175 SCCM and 9.5 SCCM. FIG. 6 represents a film deposited under similar conditions, but with argon added to the gas mixture at a flow rate of 35 SCCM. The difference in the morphologies of the films deposited with and without argon, as is apparent from the figures, is the presence of soft spots in the film of FIG. 5 but not in the film of FIG. 6.

Thus, to summarize, the net deposition rate on the sidewalls is determined by at least four processes: gross deposition at rate $r_g$, sputtering at rate $r_{sp}$, desorption at rate $r_d$, and ion-induced migration at rate $r_m$. The net deposition rate $r_{net}$ is accordingly expressed by $$r_{net} = r_g - r_{sp} - r_d - r_m.$$

It has been experimentally determined that under typical processing conditions, the desorption rate $r_d$ and the migration rate $r_m$ are much greater than the sputtering rate $r_{sp}$ (shown, e.g., as a function of bias voltage in curve B of FIG. 3), and that the migration rate $r_m$ is significantly enhanced by argon-ion bombardment.

It has also been determined that under the processing conditions of, e.g., FIG. 3, with a substrate bias between about −300 V and about −480 V, the sputtering rate is no more than about 10% of the deposition rate. For example, curve A of FIG. 3 shows the net deposition rate at respective oxygen, argon, and TEOS flow rates of 175 SCCM, 35 SCCM, and 9.5 SCCM, and curve B of FIG. 3 shows the sputtering rate under identical conditions (but with the flow of TEOS reduced to zero). It is apparent from a comparison of the two curves that the sputtering rate is only about 3% of the net deposition rate at a substrate bias of −480 V. Moreover, this fraction falls rapidly as the bias is changed (i.e., reduced in magnitude) toward −300 V. It should be noted in this regard that sputtering is generally directional, with a rate at 45° incidence typically 2-3 times the rate at 90° incidence. As a consequence, the sputtering rate in the shoulder regions of a deposited film may reach as much as about 10% of the net deposition rate under the process conditions of FIG. 3 at a bias of −480 V. However, as noted, this fraction drops rapidly as the bias approaches −300 V.

In general, a high deposition rate is desirable in order to have high process efficiency. However, in order to produce films that are free of keyholes at a high deposition rate, it is also necessary to have a high ion-bombardment rate, which, in turn, can only be achieved in the presence of very high ion density, bias voltage, and RF power. Because such conditions are conducive to radiation damage and erosion of the metallization pattern, the deposition rate cannot, as a practical matter, be made arbitrarily high. A useful range of deposition rates is about 200-600 Å/minute, and a useful range of sputtering rates (resulting from ion bombardment) is 10-50 Å/minute. As illustrated, for example, in FIG. 7, the deposition rate depends upon the ratio of the flow rate of oxygen to the flow rate of TEOS. A useful range for the volume flow ratio of oxygen to TEOS is about 10-15. In particular, at this ratio and an oxygen flow rate of 175 SCCM, the resulting deposition rate will lie between 200 Å/minute and 600 Å/minute.

Figure 7:
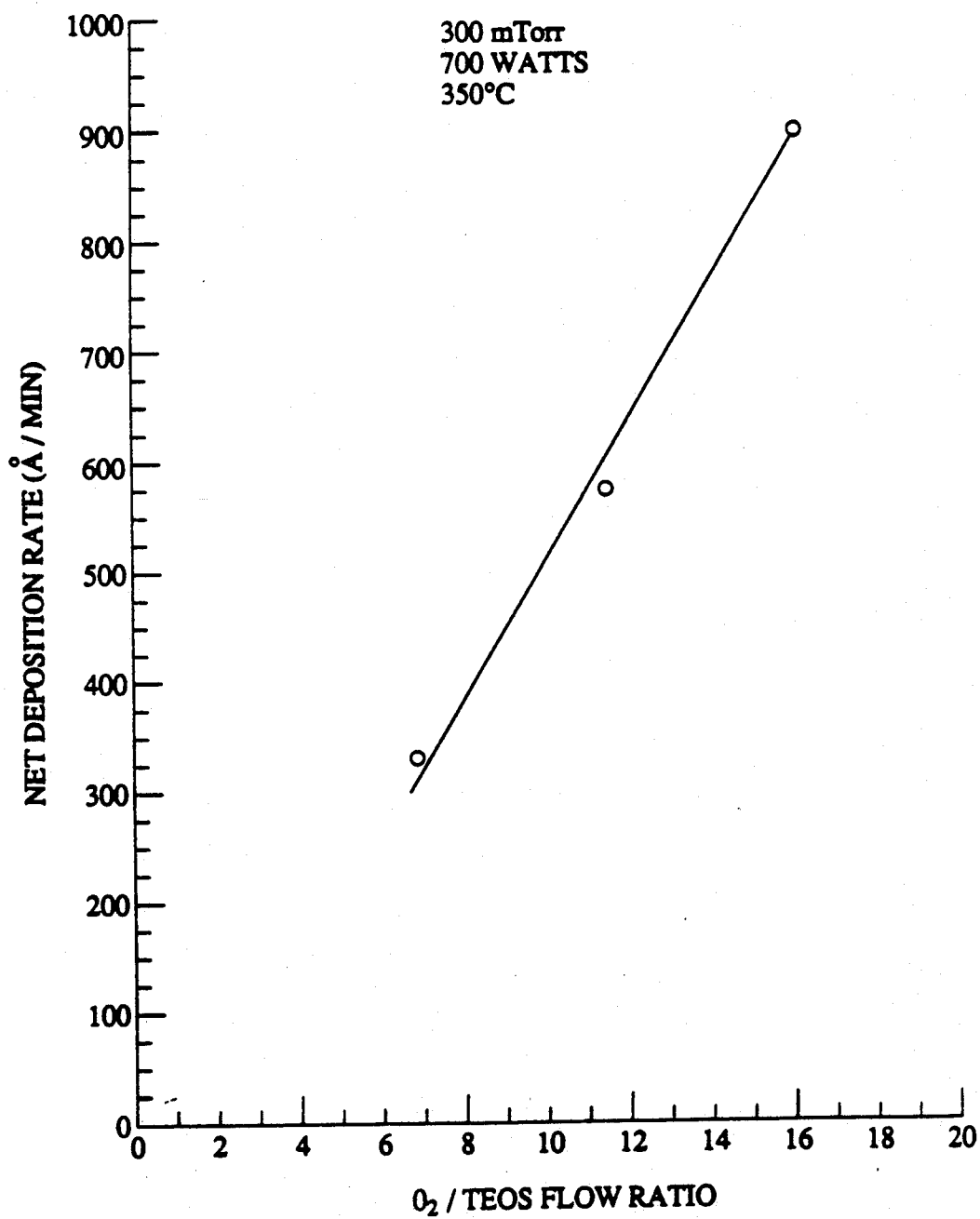
FIG. 7 is a graph showing how, in a typical case, the net deposition rate depends on the flow ratio of oxygen to TEOS.

It should be noted in this regard that although FIG. 7 corresponds to 300 mTorr pressure, 700 W RF power, and 350° C. substrate temperature, qualitatively similar results will obtain over relatively wide ranges of temperature and pressure. The temperature must be at least about 300° C. in order for surface migration to occur. However, above about 350° C., the deposition rate decreases as the temperature is further increased.

The ion-bombardment rate depends, in part, on the volume flow ratio of argon to oxygen. At an oxygen flow rate of 175 SCCM, the argon flow rate is preferably about 35 SCCM because this flow rate leads to a sputtering rate of about 10-50 Å/minute.

The oxygen flow rate is preferably about 175 SCCM because at this rate, desirable values of the pressure, bias, and deposition rate can be maintained. However, a useful range for the oxygen flow rate is from about 95 SCCM to about 175 SCCM.

EXAMPLE

Silicon wafers were provided, each having an aluminum metallization pattern 0.5 μm in height and with an 0.5-μm spacing. A silicon dioxide film 0.8-1.0 μm in thickness was formed on each wafer in accordance with the inventive method. During each deposition, the substrate temperature was 325° C., the pressure in the reactor was 300 mTorr, the RF power level was 700 W, the flow rate of TEOS was 9.5 SCCM, and the flow rate of argon was 35 SCCM.

Three batches of wafers were processed, each at a different oxygen flow rate.

The quality of the resulting films was examined in several different ways. Wet etching rates of the films were measured at 25° C. using 100 $H_2O$:1 HF etching solution. The residual stress was determined by using a laser beam to measure the radius of curvature of the wafer before and after film deposition. An ISI-42 scanning electron microscope (SEM) was used to examine the samples after etching in 100 $H_2O$:1 HF etching solution for 1 minute followed by overcoating with 200 Å of gold.

At an oxygen flow rate of 175 SCCM, the wet etch rate was 89 Å/minute, the residual stress was $-2.6 \times 10^9$ dyne/cm$^2$, and the refractive index was 1.465. At an oxygen flow rate of 125 SCCM, the wet etch rate was 82 Å/minute, the residual stress was $-2.0 \times 10^9$ dyne/cm$^2$, and the refractive index was 1.466. At an oxygen flow rate of 75 SCCM, the wet etch rate was 80 Å/minute, the residual stress was $3.4 \times 10^9$ dyne/cm$^2$, and the refractive index was 1.463.

Infrared absorption spectroscopy of the films revealed no measurable water or OH bonds at any of the oxygen flow rates, and triangular voltage-sweep (TVS) measurements revealed no mobile ionic impurities at any of the oxygen flow rates.

In a second test, films were deposited at an oxygen flow rate of 175 SCCM, a TEOS flow rate of 9.5 SCCM, a reaction-chamber pressure of 300 mTorr, an RF power level of 600 W, and a substrate temperature of 320° C. One film, the scanning electron micrograph of which is depicted in FIG. 4, was prepared with a grounded substrate and biased shower head. Another film, similarly depicted in FIG. 5, was prepared with a biased substrate and grounded shower head. A third film, depicted in FIG. 6, was prepared like the film of FIG. 5, but the gas mixture also included a flow of argon at a rate of 35 SCCM.

The films were prepared for morphological examination by scanning electron microscopy (SEM) by etching in a 100 $H_2O$:1 HF etching solution for one minute, followed by decoration with a 200 Å thick gold coating.

The SEM image of FIG. 4 reveals the presence of soft spots, key holes, and rounded shoulders. FIG. 5 shows tapered sidewalls and soft spots. FIG. 6 shows films having tapered sidewalls but no key holes or soft spots.

We claim:
1. A method comprising the steps of:
    a) providing a substrate within a vacuum chamber, the substrate having a surface and, formed on the surface, a metallization pattern at least a portion of which has an aspect ratio of 1.0 or more;
    b) providing a mixture of gases which can react in a plasma to form silicon dioxide for deposit;
    c) flowing the gas mixture over the substrate such that, in the absence of an applied RF field, the gas mixture is not substantially ionized; and
    d) applying an RF field to the substrate such that the gas mixture forms a plasma from which silicon dioxide is deposited on at least a portion of the metallization pattern, the silicon dioxide forming a film;

characterized in that
    e) the gas mixture comprises oxygen, argon, and at least one organosilicon compound selected from the group consisting of TEOS and TMCTS;

f) during the depositing step, the temperature of the substrate is at least about 325° C. but not more than about 500° C.;

g) during the depositing step, the pressure in the vacuum chamber is at least about 100 mTorr but not more than about 500 mTorr;

h) during the depositing step, the power density of the RF field is at least about 0.33 W/cm$^2$ but not more than about 1.64 W/cm$^2$, and the power level of the RF field is further selected such that the substrate is maintained, during the depositing step, at a negative dc bias of about $-300$ V to about $-500$ V;

i) during the depositing step, oxygen is provided at a flow rate in the range from about 95 SCCM to about 175 SCCM; and j) during the depositing step, the dc bias and the composition of the gas mixture are further selected such that sputtering, if present, is characterized by a total sputtering rate that is no more than about 0.1 times the net deposition rate, resulting in the formation of a silicon dioxide film substantially free of soft spots and/or key holes at a deposition rate of at least about 200 Å/minute.

2. The method of claim 1, wherein the silicon dioxide film is deposited at a deposition rate of at least about 200 Å/minute and not more than about 600 Å/minute, and the ion bombardment is characterized by a sputtering rate of at least about 10 Å/minute and not more than about 50 Å/minute.

3. The method of claim 2, wherein:
   (a) the organosilicon compound is TEOS;
   (b) the flows of oxygen, TEOS, and argon each have a flow rate;
   (c) the flow rate of oxygen is at least about 10 times, but not more than about 15 times, the flow rate of TEOS; and
   (d) the flow rate of oxygen is about 5 times the flow rate of argon.

* * * * *